(12) United States Patent
Amstatt et al.

(10) Patent No.: US 10,801,129 B2
(45) Date of Patent: Oct. 13, 2020

(54) NUCLEATION STRUCTURE SUITABLE FOR EPITAXIAL GROWTH OF THREE-DIMENSIONAL SEMICONDUCTOR ELEMENTS

(71) Applicants: COMMISSARIAT A L'ENERGIE ATOMIQUE ET AUX ENERGIES ALTERNATIVES, Paris (FR); ALEDIA, Grenoble (FR)

(72) Inventors: Benoit Amstatt, Grenoble (FR); Florian Dupont, Grenoble (FR); Ewen Henaff, Fontaine (FR); Berangere Hyot, Eybens (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 20 days.

(21) Appl. No.: 16/313,774

(22) PCT Filed: Jun. 26, 2017

(86) PCT No.: PCT/FR2017/051692
§ 371 (c)(1),
(2) Date: Dec. 27, 2018

(87) PCT Pub. No.: WO2018/002497
PCT Pub. Date: Jan. 4, 2018

(65) Prior Publication Data
US 2019/0153619 A1    May 23, 2019

(30) Foreign Application Priority Data
Jun. 28, 2016  (FR) ...................... 16 56008

(51) Int. Cl.
*H01L 21/02* (2006.01)
*H01L 33/18* (2010.01)
(Continued)

(52) U.S. Cl.
CPC .......... *C30B 29/607* (2013.01); *C30B 23/025* (2013.01); *C30B 23/04* (2013.01);
(Continued)

(58) Field of Classification Search
CPC ..... C30B 29/607; C30B 29/60; C30B 29/602; C30B 25/183; C30B 25/04; C30B 23/04;
(Continued)

(56) References Cited

U.S. PATENT DOCUMENTS

2015/0255677 A1    9/2015  Dechoux et al.
2016/0111593 A1    4/2016  Dechoux et al.
(Continued)

FOREIGN PATENT DOCUMENTS

FR            3 007 580 A1   12/2014
WO    WO 2014/064395 A1    5/2014
WO    WO 2016/116703 A1    7/2016

OTHER PUBLICATIONS

International Search Report dated Sep. 6, 2017 in PCT/FR2017/051692 filed on Jun. 26, 2017.

*Primary Examiner* — Caleen O Sullivan
(74) *Attorney, Agent, or Firm* — Oblon, McClelland, Maier & Neustadt, L.L.P.

(57) ABSTRACT

A nucleation structure for the epitaxial growth of three-dimensional semiconductor elements, including a substrate including a monocrystalline material forming a growth surface, a plurality of intermediate portions made of an intermediate crystalline material epitaxied from the growth surface and defining an upper intermediate surface, and a plurality of nucleation portions, made of a material includ- (Continued)

ing a transition metal forming a nucleation crystalline material, each epitaxied from the upper intermediate surface, and defining a nucleation surface suitable for the epitaxial growth of a three-dimensional semiconductor element.

17 Claims, 5 Drawing Sheets

(51) Int. Cl.
*H01L 33/00* (2010.01)
*H01L 33/24* (2010.01)
*C03B 23/02* (2006.01)
*C03B 23/04* (2006.01)
*C03B 25/04* (2006.01)
*C30B 29/60* (2006.01)
*C30B 23/02* (2006.01)
*C30B 23/04* (2006.01)
*C30B 25/04* (2006.01)
*C30B 25/18* (2006.01)

(52) U.S. Cl.
CPC ............ *C30B 25/04* (2013.01); *C30B 25/183* (2013.01); *C30B 29/60* (2013.01); *C30B 29/602* (2013.01); *H01L 21/0254* (2013.01); *H01L 21/0262* (2013.01); *H01L 21/02381* (2013.01); *H01L 21/02433* (2013.01); *H01L 21/02491* (2013.01); *H01L 21/02502* (2013.01); *H01L 21/02603* (2013.01); *H01L 33/007* (2013.01); *H01L 33/18* (2013.01); *H01L 33/24* (2013.01); *H01L 21/02639* (2013.01)

(58) Field of Classification Search
CPC ....... C30B 23/025; H01L 33/24; H01L 33/18; H01L 33/007; H01L 21/0262; H01L 21/02603; H01L 21/0254; H01L 21/02502; H01L 21/02491; H01L 21/02433; H01L 21/02381; H01L 21/02639
USPC .......................................... 438/478
See application file for complete search history.

(56) References Cited

U.S. PATENT DOCUMENTS

2016/0284938 A1   9/2016   Hyot et al.
2018/0277717 A1*  9/2018   Amstatt .................. H01L 33/24

* cited by examiner

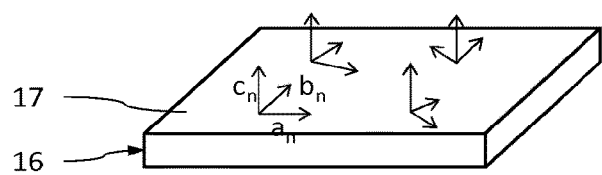
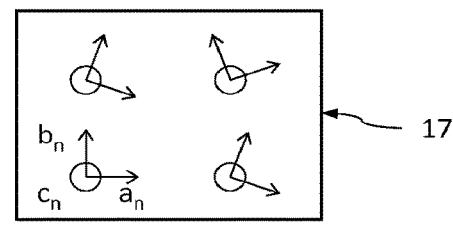
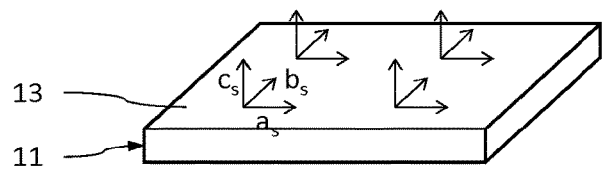
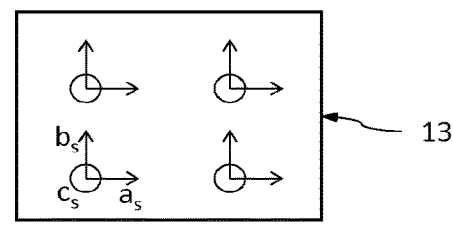
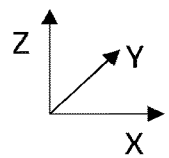
Fig.2A
Fig.2B
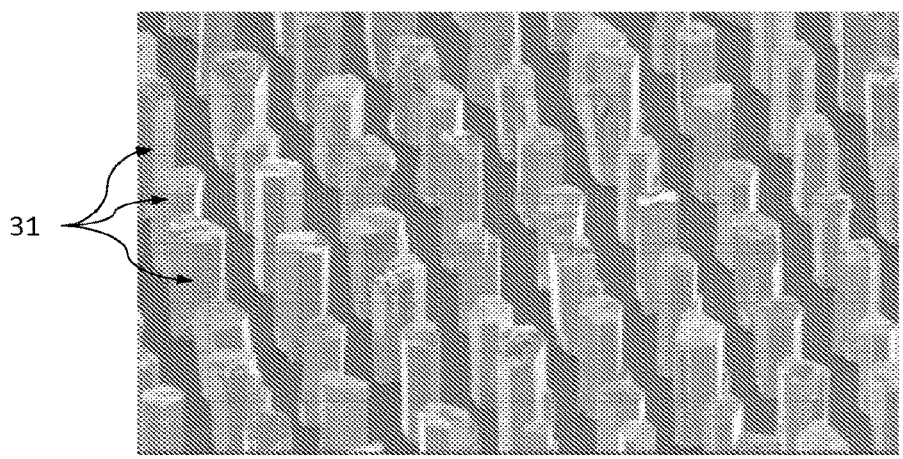
Fig.2C

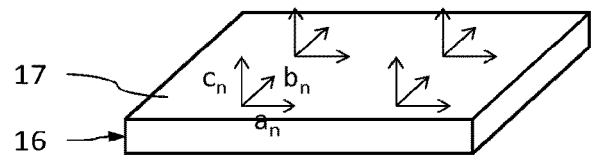
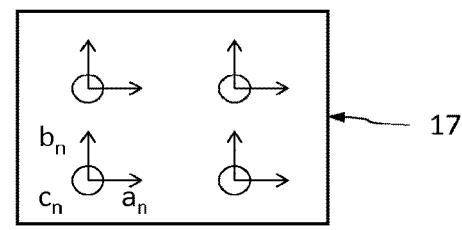
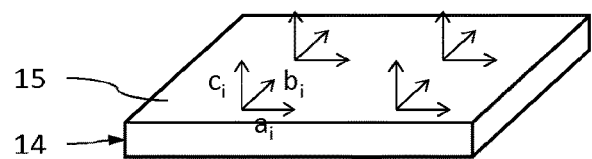
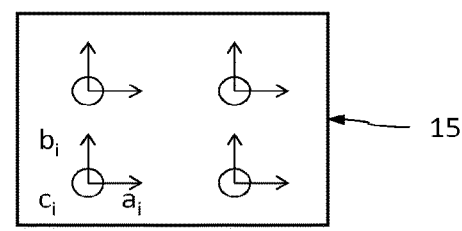
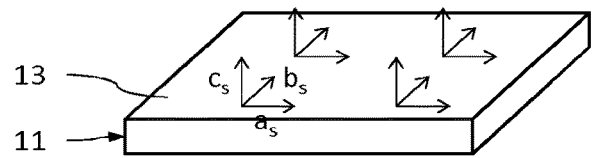
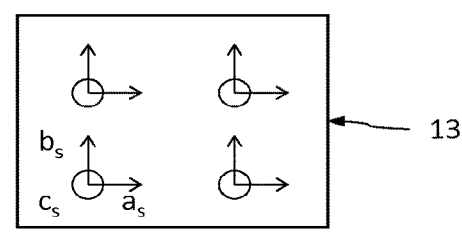
Fig.3A
Fig.3B
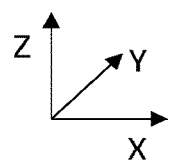
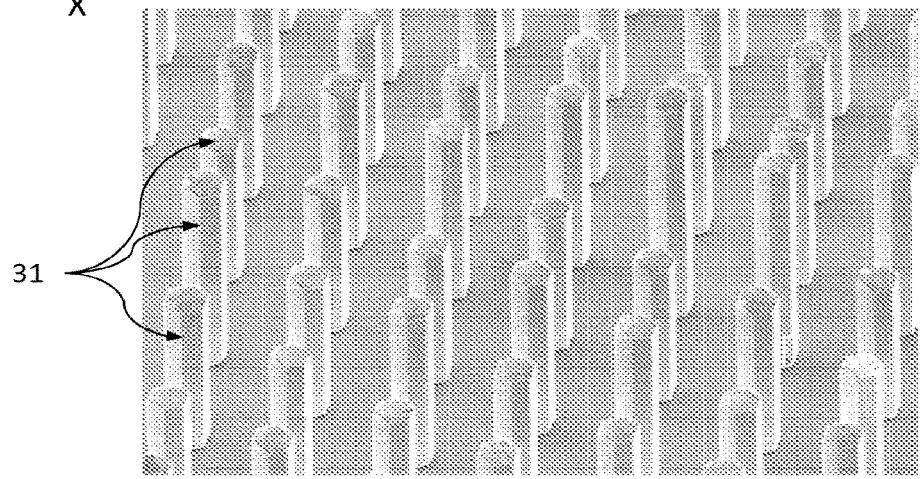
Fig.3C

NUCLEATION STRUCTURE SUITABLE FOR EPITAXIAL GROWTH OF THREE-DIMENSIONAL SEMICONDUCTOR ELEMENTS

TECHNICAL FIELD

The field of the invention is that of optoelectronic devices comprising three-dimensional semiconductor elements, such as nanowires or microwires, and relates in particular to a nucleation structure comprising at least one nucleation portion, made of a material comprising a transition metal, suitable for the epitaxial growth of such a three-dimensional element.

PRIOR ART

Optoelectronic devices exist that comprise three-dimensional semiconductor elements, of nanowire or microwire type, forming for example a portion of light-emitting diodes. The nanowires or microwires may thus form a first doped portion, for example of n type, a part of which is covered by an active zone comprising for example at least one quantum well, and by a second doped portion of the type having opposite conductivity, for example of p type.

The nanowires or microwires may be produced in an axial configuration in which the active zone and the second p-doped portion extend essentially in the continuation of the first n-doped portion, along a longitudinal axis of epitaxial growth, without surrounding the periphery of the latter. They may for example be produced in a core/shell configuration, also referred to here as radial configuration, in which the active zone and the second p-doped portion surround the periphery of at least one part of the first n-doped portion.

The nucleation of the wires, and also their epitaxial growth, may be carried out using a nucleation portion, for example made of aluminium nitride AlN or made of a transition metal nitride, which rests on a semiconductor substrate, for example made of crystalline silicon.

Document WO 2011/162715 describes an example of a nucleation portion made of titanium nitride. This nucleation layer may be deposited by low-pressure chemical vapour deposition (LPCVD) or atmospheric pressure chemical vapour deposition (APCVD).

There is however a need for a nucleation structure with nucleation portions, for example made of transition metal nitride, which is suitable for the nucleation and the epitaxial growth of three-dimensional semiconductor elements, and which makes it possible to improve the homogeneity of the optical and/or electronic properties of said three-dimensional semiconductor elements.

SUMMARY OF THE INVENTION

The objective of the invention is to at least partly overcome the drawbacks of the prior art, and more particularly to provide a nucleation structure with nucleation layer, made of a material comprising a transition metal, which is suitable for the nucleation and the epitaxial growth of three-dimensional semiconductor elements, the optical and/or electronic properties of which have an improved homogeneity.

For this, one subject of the invention is a nucleation structure suitable for the epitaxial growth of three-dimensional semiconductor elements, comprising a substrate comprising a monocrystalline material forming a growth surface on which lies a plurality of nucleation portions made of a material comprising a transition metal. According to the invention, it also comprises a plurality of intermediate portions, each intermediate portion being made of an intermediate crystalline material epitaxied from said growth surface and defining an upper intermediate surface, on the opposite side to the growth surface; each nucleation portion being made of a material comprising a transition metal forming a nucleation crystalline material, epitaxied from the upper intermediate surface, and defining a nucleation surface, opposite the upper intermediate surface and suitable for the epitaxial growth of a three-dimensional semiconductor element.

The intermediate crystalline material is epitaxied from the growth surface. It thus has an alignment of the crystallographic orientations of its crystal lattice in at least one direction in the plane of the material and at least one direction orthogonal to the plane of the material with those of the crystal lattice of the crystalline material of the substrate. The plane of the material is here the growth plane of the intermediate crystalline material. Furthermore, the nucleation crystalline material is epitaxied from the upper intermediate surface. It thus has an alignment of the crystallographic orientations of its crystal lattice in at least one direction in the plane of the material and at least one direction orthogonal to the plane of the material with those of the crystal lattice of the intermediate material. The plane of the material is here the growth plane of the nucleation crystalline material.

Therefore, in so far as the intermediate portions are all epitaxied from the same growth surface which is formed by a monocrystalline material, they all have the same crystallographic orientations, at any point of the upper intermediate surfaces, and from one intermediate portion to the next. The same is then true for the nucleation portions, which also all have the same crystallographic orientations, at any point of the nucleation surfaces, and from one nucleation portion to the next.

Certain preferred, but nonlimiting aspects of this nucleation structure are the following:

The intermediate portions may form blocks that are separate from one another, and the nucleation portions may be at least partly bordered by and in contact with injection portions, made of a material comprising a transition metal, which lie in contact on the growth surface. The injection portions, in so far as they are formed from the growth surface and not from an upper intermediate surface, are then textured and not epitaxied. They thus have a single favoured crystallographic orientation in a direction orthogonal to the plane of its material. The plane of its material is here the growth plane of the material of the injection portion, here parallel to the plane of the substrate.

The intermediate material may be selected from aluminium nitride, III-V compounds and oxides of aluminium, titanium, hafnium, magnesium and zirconium, and may have a hexagonal, face-centred cubic or orthorhombic crystal structure.

The nucleation material may be selected from titanium, vanadium, chromium, zirconium, niobium, molybdenum, hafnium, tantalum and tungsten, or from a nitride or a carbide of titanium, vanadium, chromium, zirconium, niobium, molybdenum, hafnium, tantalum and tungsten, and may have a hexagonal or face-centred cubic crystal structure.

The monocrystalline material of the substrate may be selected from a group III-V compound, a II-VI compound or a IV element or compound and may have a hexagonal or face-centred cubic crystal structure.

The material of the substrate may be electrically conductive.

The nucleation structure may comprise at least one lower injection portion made of a material comprising a transition metal, positioned in contact with the growth surface and covered by an injection portion formed in one piece with and from the same material as the nucleation portion. The lower injection portion, in so far as it is formed from the growth surface and not from an upper intermediate surface, is textured and not epitaxied. It thus has a single favoured crystallographic orientation in a direction orthogonal to the plane of its material. The plane of its material is here the growth plane of the material of the lower injection portion, here parallel to the plane of the substrate.

The nucleation structure may comprise at least one upper injection portion made of a material comprising a transition metal, positioned in contact with the nucleation portion and partly covering the nucleation surface.

The invention also relates to an optoelectronic device, comprising said nucleation structure according to any one of the preceding features, and a plurality of three-dimensional semiconductor elements each epitaxied from a respective nucleation surface. The three-dimensional semiconductor elements thus have an alignment of the crystallographic orientations of their crystal lattice with those of the crystal lattice of the nucleation material, in at least one direction in the plane of the material and at least one direction orthogonal to the plane of the material. The plane of the material is the growth plane of the material of the three-dimensional semiconductor elements. In so far as the nucleation material of the various nucleation portions has the same crystallographic orientations at any point of the nucleation surfaces and from one nucleation portion to the next, the three-dimensional semiconductor elements also have the same crystallographic orientations, from one three-dimensional element to the next.

Each three-dimensional semiconductor element may be produced from a semiconductor material selected from a III-V compound, a II-VI compound, a IV element or compound.

The semiconductor material of each three-dimensional semiconductor element may predominantly comprise a III-V compound formed from a first element from group III and from a second element from group V, the three-dimensional semiconductor elements having a polarity of the first element.

The invention also relates to a process for producing the nucleation structure according to any one of the preceding features, comprising a step of epitaxial growth of the nucleation portions by sputtering at a growth temperature between ambient temperature and 500° C.

The process may comprise a step of forming at least one upper injection portion positioned in contact with the nucleation portion and partly covering the nucleation surface, comprising the substeps of:
  epitaxial growth of a layer made of a second material comprising a transition metal covering the nucleation surface;
  deposition of a layer of a dielectric material covering the layer made of the second material;
  localized and selective dry etching of said dielectric material with respect to the second material, so as to form a first opening located facing the nucleation surface and opening onto the second material;
  localized and selective wet etching of said second material with respect to the nucleation material, through the first opening, so as to form an opening that opens onto the nucleation surface.

The process may comprise a step of crystallization annealing of the nucleation portions at a temperature between 600° C. and 1200° C.

The invention also relates to a process for producing an optoelectronic device according to any one of the preceding features, comprising:
  the production of the nucleation structure according to any one of the preceding features;
  the growth of a plurality of three-dimensional semiconductor elements each epitaxied from a nucleation surface, so that the nucleation portions, between the production step and the growth step, have not been subjected to a nitridation annealing.

Between the step of producing the nucleation structure and the step of growth of a plurality of three-dimensional semiconductor elements, the nucleation surfaces may not be subjected, at the same time, to an annealing temperature greater than or equal to 800° C. and to a flow of ammonia.

BRIEF DESCRIPTION OF THE DRAWINGS

Other aspects, objectives, advantages and features of the invention will become more apparent on reading the following detailed description of preferred embodiments thereof, given by way of nonlimiting example, and with reference to the appended drawings in which:

FIGS. 2A and 2B are respectively perspective and top views, in exploded view, of the growth and nucleation surfaces in the absence of an intermediate portion, and FIG. 2C is a perspective view of wires epitaxied from the nucleation surface;

FIGS. 3A and 3B are respectively perspective and top views, in exploded view, of the growth surface, of the upper intermediate surface and of the nucleation surface (arranged from bottom to top), and FIG. 3C is a perspective view of wires epitaxied from the nucleation surface;

DETAILED DESCRIPTION OF PARTICULAR EMBODIMENTS

Figure 1A:
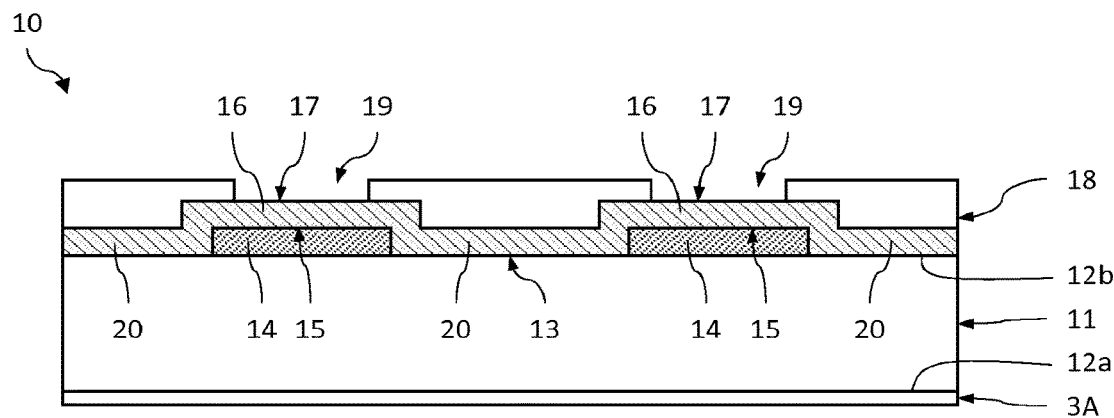
FIGS. 1A and 1B are partial and schematic views, in transverse cross section, of a nucleation structure according to one embodiment (FIG. 1A) and of an optoelectronic device with light-emitting diodes (FIG. 1B) comprising the nucleation structure illustrated in FIG. 1A.

In the figures and in the remainder of the description, the same references represent identical or similar elements. Furthermore, the various elements are not represented to scale in order to make the figures clearer. Furthermore, the various embodiments and variants are not mutually exclusive and may be combined together. Unless otherwise indicated, the terms "substantially", "around", "of the order of" mean "to within 10%" or, when it relates to an orientation, "to within 10°".

The invention relates to a nucleation structure suitable for the nucleation and the epitaxial growth of three-dimensional semiconductor elements intended to form light-emitting diodes or photodiodes.

The three-dimensional semiconductor elements may have an elongated shape along a longitudinal axis Δ, that is to say the longitudinal dimension of which along the longitudinal axis Δ is greater than the transverse dimensions. The three-dimensional elements are then referred to as "wires", "nanowires" or "microwires". The transverse dimensions of the wires, that is to say their dimensions in a plane orthogonal to the longitudinal axis Δ, may be between 10 nm and 10 μm, for example between 100 nm and 10 μm, and preferably between 100 nm and 5 μm. The height of the wires, that is to say their longitudinal dimension along the longitudinal axis Δ, is greater than the transverse dimensions, for example 2 times, 5 times and preferably at least 10 times greater.

The cross section of the wires, in a plane orthogonal to the longitudinal axis Δ, may have various shapes, for example a shape that is circular, oval, polygonal for example triangular, square, rectangular or even hexagonal. The diameter is defined here as being a quantity associated with the perimeter of the wire at a cross section. It may be the diameter of a disc having the same surface area as the cross section of the wire. The local diameter is the diameter of the wire at a given height thereof along the longitudinal axis Δ. The mean diameter is the mean, for example arithmetic mean, of the local diameters along the wire or a portion thereof.

The nucleation structure comprises a plurality of stacks which rest on a growth surface defined by one and the same monocrystalline material of a substrate, each stack being formed of a nucleation portion made of a material comprising a transition metal epitaxied from an intermediate portion made of a crystalline material, this material also being epitaxied from the growth surface of the substrate.

Epitaxy is understood to mean that the epitaxied crystalline material comprises a crystal lattice, or crystal structure, in epitaxial relationship with that of the nucleation material from which it is epitaxied. An epitaxial relationship is understood to mean that the epitaxied material has an alignment of the crystallographic orientations of its crystal lattice, in at least one direction in the plane of the material and at least one direction orthogonal to the plane of the material, with those of the crystal lattice of the nucleation material. The plane of the epitaxied material is here a growth plane of the material, parallel to the nucleation surface. The alignment is preferably achieved to within 30°, or even to within 10°. This is expressed by the fact that there is a complete match of orientation and of crystallographic position between the crystal lattice of the epitaxied material and that of the nucleation material. Preferably, the epitaxied crystalline material has a lattice parameter $a_2$, measured in the growth plane, such that the lattice mismatch $m=(a2-a1)/a1=\Delta a/a_1$ with the nucleation material, of lattice parameter $a_1$, is less than or equal to 20%.

Generally, a crystalline (monocrystalline or polycrystalline) material has a crystal lattice, the unit cell of which is in particular defined by a set of crystallographic axes, or primitive vectors, denoted subsequently, by way of illustration, a, b, c (the unit cell may however be defined using more than three crystallographic axes, in particular when the crystal lattice is of hexagonal type). Purely by way of illustration, the crystalline material may have various types of structure, for example of face-centred cubic type, the growth direction of which is for example oriented along the direction [111] (or <111> if the whole family of directions is considered) or of hexagonal type, oriented for example along the direction [0001]. A polycrystalline material is understood to mean a material formed from several crystals separated from one another by grain boundaries.

Thus, when a crystalline material is epitaxied from a crystalline nucleation material, that is to say formed by epitaxial growth, the epitaxial relationship between these two crystalline materials is expressed by the fact that at least one crystallographic axis of the crystal lattice of the epitaxied material, oriented in the plane of the epitaxied material, for example $a_e$ and/or $b_e$, and at least one crystallographic axis, oriented orthogonally to the plane, for example $c_e$, are respectively substantially parallel to the crystallographic axes $a_n$ and/or $b_n$, and $c_n$ of the crystal lattice of the nucleation material.

Furthermore, in the case where the nucleation material is monocrystalline as is the case in the invention, the axes $a_n$, $b_n$, $c_n$ are respectively substantially parallel to one another at any point of the nucleation surface, in other words the axes $a_n$ are substantially parallel to one another at any point of the nucleation surface, just like the axes $b_n$, $c_n$. Consequently, in a plane of the epitaxied material parallel to the nucleation surface, the crystallographic axes $a_e$, $b_e$, $c_e$ of the epitaxied material are respectively substantially parallel to one another.

An epitaxied material is a particular case of textured materials in the sense that textured materials have a preferential crystallographic direction oriented orthogonally to the plane of the material, but do not have a preferential crystallographic direction oriented in the plane of the material. Furthermore, the preferential crystallographic direction orthogonal to the plane of the textured material is not, or not very dependent on the crystalline properties of the nucleation material.

Thus, a textured material has a single favoured crystallographic direction, for example that of the axis c and not three favoured directions. The lattice of the textured material then has a polycrystalline structure, the various crystalline domains of which, separated by grain boundaries, are all oriented along the same favoured crystallographic axis c. On the other hand, they do not have parallelism relationships between one another in the growth plane. In other words, the axes c of the crystalline domains are parallel to one another but the axes a, like the axes b, are not parallel to one another and are oriented substantially randomly. This favoured crystallographic direction is not, or not very dependent on the crystalline properties of the nucleation material. Thus, it is possible to obtain a textured material from a nucleation material having a monocrystalline, polycrystalline or even amorphous structure.

FIG. 1A is a schematic view in transverse cross section of a nucleation structure 10 according to one embodiment.

Defined here and for the remainder of the description is a three-dimensional direct marker (X,Y,Z), where the axes X and Y form a plane parallel to the main plane of the substrate 11, and where the axis Z is oriented substantially orthogonal to the plane of the substrate 11. In the remainder of the description, the terms "vertical" and "vertically" are understood as relating to an orientation substantially parallel to the axis Z, and the terms "horizontal" and "horizontally" as relating to an orientation substantially parallel to the plane (X,Y). Furthermore, the terms "lower" and "upper" are understood as relating to a position that increases on moving away from the substrate 11 along the direction +Z.

The nucleation structure 10 comprises:
- a substrate 11, comprising a growth surface 13 formed by a monocrystalline material;
- a plurality of intermediate portions 14, made of an intermediate material epitaxied from the growth surface 13 of the substrate 11, and having an opposite surface referred to as an upper intermediate surface 15;
- a plurality of nucleation portions 16, made of a material comprising a transition metal epitaxied from the upper intermediate surface 15, and each having an opposite surface referred to as a nucleation surface 17.

The substrate 11 comprises an upper face, at least one part of which forms a growth surface 13, this being the surface from which the wires are intended to be formed. It may be a monoblock structure, or be formed from a stack of layers such as a substrate 11 of SOI (Silicon On Insulator) type.

It comprises a monocrystalline growth material at least at the growth surface 13. Thus, at the growth surface 13, the growth material is formed of a single crystal and does not therefore comprise several crystals separated from one another by grain boundaries. The crystal lattice of the monocrystalline material has a unit cell defined in particular by its crystallographic axes denoted here, purely by way of illustration, $a_s$, $b_s$, $c_s$. The crystallographic axes $a_s$, $b_s$, $c_s$ are respectively substantially parallel to one another at any point of the growth surface 13. In other words, the crystallographic axes $a_s$ are substantially parallel to one another at any point of the growth surface 13. The same is true, respectively, for the crystallographic axes $b_s$ and $c_s$.

The growth material has crystallographic properties, in terms of lattice parameter and type of structure, which are suitable for the epitaxial growth of a crystalline material of the intermediate portion 14. Thus, it preferably has a crystal structure of face-centred cubic type oriented along the direction [111] or a crystal structure of hexagonal type oriented along the direction [0001]. Equally preferably, it has a lattice parameter $a_s$ such that the lattice mismatch $m=\Delta a/a_s$ with the material of the intermediate portion 14 is less than or equal to 20%.

The growth material may be a semiconductor monocrystalline material, which may be selected from III-V compounds comprising at least one element from group III and at least one element from group V of the Periodic Table, II-VI compounds or IV elements or compounds. By way of example, it may be silicon, germanium, silicon carbide. It is advantageously electrically conductive and advantageously has an electrical resistivity similar to that of metals, preferably less than or equal to several mohm·cm. The material of the substrate 11 may be highly doped, for example with a dopant concentration of between $5 \times 10^{16}$ atoms/cm³ and $2 \times 10^{20}$ atoms/cm³.

In this example, the growth material of the substrate 11 is n-type highly doped monocrystalline silicon, having a face-centred cubic crystal structure, the growth plane of which is oriented along the direction [111], and the lattice parameter $a_s$ of which is around 3.84 Å.

The nucleation structure 10 comprises a plurality of intermediate portions 14. Each intermediate portion 14 is epitaxied from the growth surface 13. More specifically, it is made of an intermediate crystalline material epitaxied from the growth surface 13. The intermediate material delimits an opposite surface, referred to as an upper intermediate surface 15.

The intermediate material comprises a crystal lattice in epitaxial relationship with that of the growth material. The crystal lattice of the intermediate material has a unit cell defined in particular by its crystallographic axes denoted here, purely by way of illustration, $a_i$, $b_i$, $c_i$. The crystal lattice therefore has an alignment of at least one crystallographic axis $a_i$, $b_i$ oriented in the plane of the material and of at least one crystallographic axis $c_i$ oriented orthogonally to the plane of the material, with the crystallographic axes $a_s$, $b_s$ and $c_s$ of the growth material, respectively. This is expressed by the fact that the crystallographic axis $a_i$ is substantially parallel, at any point of the upper intermediate surface 15, to the crystallographic axis $a_s$, just like, respectively, the crystallographic axes $b_i$ and $c_i$ relative to the crystallographic axes $b_s$ and $c_s$. Furthermore, whether the intermediate material is monocrystalline or polycrystalline, due to its epitaxial relationship with the monocrystalline material of the growth surface, each crystallographic axis $a_i$, $b_i$, $c_i$ is substantially identical at any point of the upper intermediate surface 15. In other words, the crystallographic axes $a_i$ are substantially identical, that is to say parallel to one another, at any point of the upper intermediate surface 15, just like, respectively, the crystallographic axes $b_i$ and $c_i$.

The intermediate material has crystallographic properties, in terms of lattice parameter and type of crystal structure, such that it is suitable for being epitaxied from the growth material of the substrate 11. It is furthermore suitable for enabling the epitaxial growth of the nucleation portion 16 made of a material comprising a transition metal from the upper intermediate surface 15. It has, preferably, a lattice parameter such that the lattice mismatch with the growth material is less than or equal to 20%. Furthermore, the type of crystal structure is such that its crystallographic axes $a_i$, $b_i$, $c_i$ may be respectively parallel to the axes $a_s$, $b_s$, $c_s$ of the growth material. The crystal structure may be of face-centred cubic type, oriented along the direction [111], or of hexagonal type oriented along the direction [0001], or even of orthorhombic type oriented along the direction [111].

The intermediate material may be a material selected from III-V compounds such as aluminium nitride AlN, gallium nitride GaN, aluminium gallium nitride AlGaN, IV-V compounds such as silicon nitride SiN, II-VI compounds such as ZnO, or IV elements or compounds such as SiC. It may also be a material selected from magnesium oxide MgO, hafnium oxide $HfO_2$, zirconium oxide $ZrO_2$, titanium oxide $TiO_2$ or aluminium oxide $Al_2O_3$. It may also be a magnesium nitride, for example $Mg_3N_2$. Advantageously it is electrically conductive.

In this example, the intermediate material is aluminium nitride AlN, having a lattice parameter of around 3.11 Å, and a hexagonal-type crystal structure, the growth plane of which is oriented along the direction [0001].

The intermediate portions 14 are here blocks that are separate from one another. As a variant, they may be zones of one and the same continuous layer made from one and the same intermediate crystalline material. A layer is understood to mean an area of a crystalline material, the thickness of which along the axis Z is, for example 10 times or even 20 times, smaller than its longitudinal width and length dimensions in the plane (X,Y). A block is understood to mean a volume of a crystalline material, the thickness of which is smaller than, equal to or even greater than its longitudinal width and length dimensions, and of which its longitudinal dimensions are smaller than those of the layer.

The intermediate portions 14 have a mean dimension, in the plane (X,Y), of between several tens of nanometres and several microns, for example between 20 nm and 20 μm, preferably of between 200 nm and 10 μm, and preferably of between 800 nm and 5 μm, for example of the order of 1 μm or 1.5 μm. It is advantageously greater than the local diameter of the wire at the interface with the nucleation portion 16. They additionally have a thickness of the order of several nanometres to several hundreds of nanometres, for example of between 5 nm and 500 nm, preferably of between 10 nm and 100 nm, for example of the order of 20 nm.

The nucleation structure 10 comprises a plurality of nucleation portions 16. Each nucleation portion 16 is intended to enable the nucleation and the epitaxial growth of at least one wire, and preferably a single wire. Each nucleation portion 16 is epitaxied from the upper intermediate surface 15. More specifically, it is made of a nucleation crystalline material epitaxied from the upper intermediate surface 15. It forms a surface referred to as a nucleation surface 17, on the opposite side to the upper intermediate surface 15.

The nucleation material comprises a crystal lattice in epitaxial relationship with that of the intermediate material. The crystal lattice of the nucleation material has a unit cell defined in particular by its crystallographic axes denoted here, purely by way of illustration, $a_n$, $b_n$, $c_n$. The crystal lattice therefore has an alignment of at least one crystallographic axis $a_n$, $b_n$ oriented in the plane of the material and of at least one crystallographic axis $c_n$ oriented orthogonally to the plane of the material, with the crystallographic axes $a_i$, $b_i$, and $c_i$, of the intermediate material, respectively, at the upper intermediate surface 15. This is expressed by the fact that the crystallographic axis $a_n$ is substantially parallel, at any point of the nucleation surface 17, to the crystallographic axis $a_i$ of the upper intermediate surface 15, just like the crystallographic axes $b_n$ and $c_n$ relative to the crystallographic axes $b_i$ and $c_i$. Furthermore, whether the nucleation material is monocrystalline or polycrystalline, each crystallographic axis $a_n$, $b_n$, $c_n$ is identical at any point of the nucleation surface 17. In other words, the crystallographic axes $a_n$ are identical, that is to say parallel to one another, at any point of the nucleation surface 17, just like, respectively, the crystallographic axes $b_n$ and $c_n$.

The nucleation material has crystallographic properties, in terms of lattice parameter and type of structure, such that it can be epitaxied from the intermediate material. It is furthermore suitable for the epitaxial growth, starting from the nucleation surface 17, of a wire. Preferably, it thus has a lattice parameter such that the lattice mismatch with the intermediate material is less than or equal to 20%. Furthermore, the type of crystal structure is such that its crystallographic axes $a_n$, $b_n$, $c_n$ may be respectively parallel to the axes $a_i$, $b_i$, $c_i$ of the intermediate material. The crystal structure may be of face-centred cubic type oriented along the direction [111] or of hexagonal type oriented along the direction [0001], or even of orthorhombic type oriented along the direction [111].

The nucleation material comprises a transition metal, that is to say that it may be made of a transition metal or made of a compound comprising a transition metal, for example a nitride or a carbide of the transition metal. Transition metals, and also the nitrides and carbides thereof, in particular have the advantage of a good electrical conductivity, similar to that of metals. The nucleation material may be selected from titanium Ti, zirconium Zr, hafnium Hf, vanadium V, niobium Nb, tantalum Ta, chromium Cr, molybdenum Mo and tungsten W, a nitride of these elements TiN, ZrN, HfN, VN, NbN, TaN, CrN, MoN, or WN, or a carbide of these elements TiC, ZrC, HfC, VC, NbC, TaC, CrC, MoC, WC. The transition metal nitrides and carbides may comprise an atomic proportion of transition metal other than 50%. Preferably, the nucleation material is selected from a nitride of titanium TiN, of zirconium ZrN, of hafnium HfN, of vanadium VN, of niobium NbN, of tantalum TaN, of chromium CrN, of molybdenum MoN or of tungsten WN, or a carbide of titanium TiC, of zirconium ZrC, of hafnium HfC, of vanadium VC, of niobium NbC or of tantalum TaC. Preferably, the nucleation material is selected from a nitride or a carbide of titanium TiN, TiC, of zirconium ZrN, ZrC, of hafnium HfN, HfC, of vanadium VN, VC, of niobium NbN, NbC, or of tantalum TaN, TaC. Preferably, the nucleation material is selected from a nitride of titanium TiN, of zirconium ZrN, of hafnium HfN, of niobium NbN, or of tantalum TaN. Preferably, the nucleation material is selected from a nitride of hafnium HfN or of niobium NbN.

The nucleation portions 16 have a mean dimension, in the plane (X,Y), of between several tens of nanometres and several microns, for example between 20 nm and 20 μm, preferably of between 200 nm and 10 μm, and preferably of between 800 nm and 5 μm, for example of the order of 1 μm to 3 μm. It is advantageously greater than the local diameter of the wire at the interface with the nucleation portion 16. They additionally have a thickness of the order of several nanometres to several hundreds of nanometres, for example of between 5 nm and 500 nm, preferably of between 10 nm and 100 nm, for example of the order of 20 nm.

The nucleation portions 16 are here zones of one and the same continuous layer made from the same crystalline nucleation material. As a variant, the nucleation portions 16 may be blocks that are separate from one another.

The nucleation portions 16 are here in contact with the intermediate portions 14 and cover these at the upper intermediate surface 15. The continuous layer additionally comprises injection portions 20 located in contact with the growth surface 13 of the substrate 11. The injection portions 20 are in contact with the nucleation portions 16. In this example, each injection portion 20 is in contact with adjacent nucleation portions 16. As a variant, each nucleation portion 16 may be in contact with an injection portion 20, for example which is peripheral, in contact with the growth surface 13, without these portions belonging to one and the same continuous layer.

This configuration of the nucleation portions 16 in contact with injection portions 20 is particularly advantageous when the intermediate material is electrically insulating, or has a band gap greater than that of the nucleation material. Thus, the charge carriers may be injected into the nucleation portions 16 from the substrate 11 by passing through the injection portions 20. This is the case in particular when the substrate 11 is made of silicon, which is preferably highly doped, and when the intermediate portions 14 are made of AlN.

The nucleation structure 10 may additionally comprise a dielectric layer that covers the nucleation surface 16, and forms a growth mask 18 allowing the epitaxial growth of the wires from openings 19 that open locally on the nucleation surfaces. The dielectric layer is composed of an electrically insulating material, such as, for example, a silicon oxide (for example $SiO_2$) or a silicon nitride (for example $Si_3N_4$ or SiN), or even a silicon oxynitride, an aluminium oxide or a hafnium oxide.

The nucleation structure 10 may also comprise a first polarization electrode 3A in contact with the substrate 11, which here is electrically conductive, for example at its rear face. It may be made from aluminium or any other suitable material.

Figure 1B:
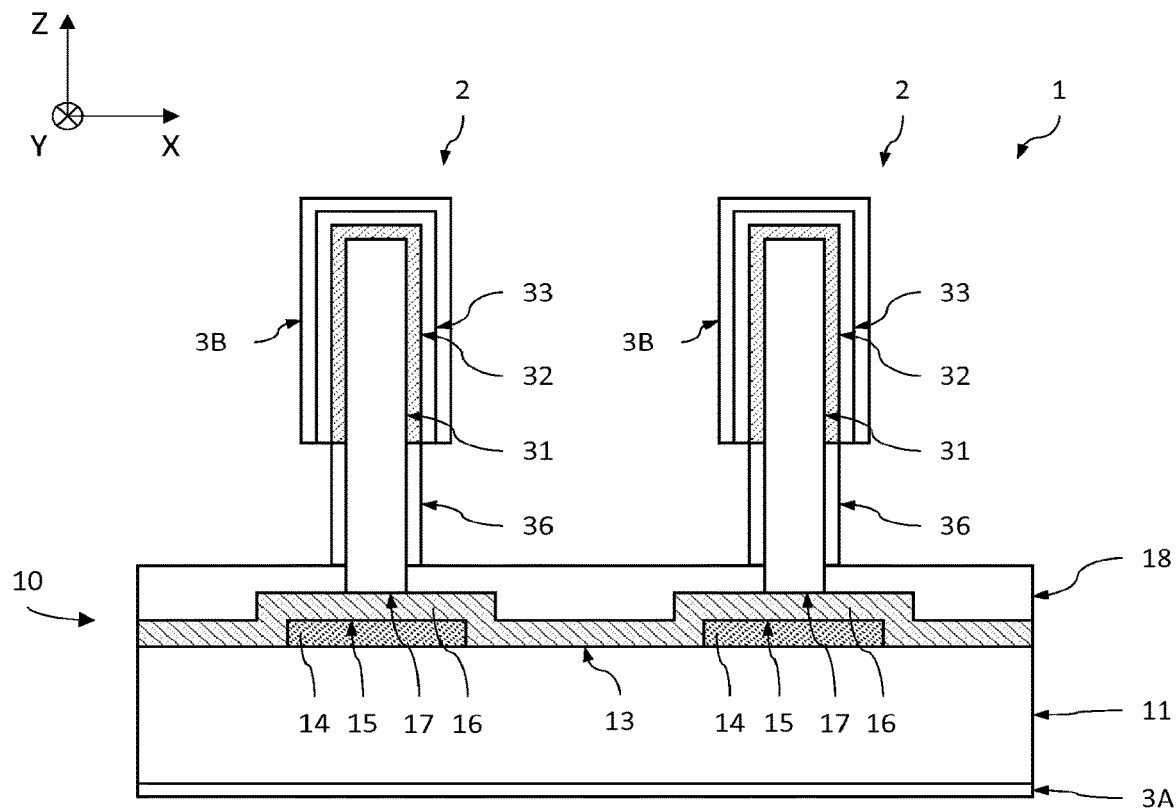

FIG. 1B is a schematic view, in transverse cross section, of an optoelectronic device 1 having light-emitting diodes 2 here in radial configuration, comprising a nucleation structure 10 from which three-dimensional semiconductor elements, here wires, of light-emitting diodes 2 are formed by epitaxial growth.

Each light-emitting diode 2 comprises a first three-dimensional semiconductor element, here a wire, that extends from the nucleation portion 16, along a longitudinal axis Δ oriented substantially orthogonally to the plane (X,Y) of the growth surface 13. Each diode 2 additionally comprises an active zone 32 and a second doped portion 33, and also a layer of second polarization electrode 3B, in contact with the second doped portion 33.

The wire rests on the substrate 11 and is in contact with the nucleation portion 16. It extends along the longitudinal axis Δ and forms the core of the light-emitting diode 2 in core/shell configuration.

The wire is made from a crystalline material epitaxied from the nucleation surface 17. The material of the wire comprises a crystal lattice in epitaxial relationship with that of the nucleation material. The crystal lattice of the material of the wire has a unit cell defined in particular by its crystallographic axes denoted here, purely by way of illustration, $a_f$, $b_f$, $c_f$. The crystallographic axes $a_f$, $b_f$, $c_f$ of the material of the wire are respectively substantially parallel to the crystallographic axes $a_n$, $b_n$, $c_n$ of the nucleation material at the nucleation surface 17. In other words, the crystallographic axis $a_f$ is parallel to the crystallographic axis $a_n$ of the nucleation surface 17. The same is true for the crystallographic axes $b_f$ and $c_f$ relative to the crystallographic axes $b_n$ and $c_n$. Furthermore, in so far as the crystallographic axes $a_n$, $b_n$, $c_n$ are respectively identical from one nucleation surface 17 to the next, each crystallographic axis $a_f$, $b_f$, $c_f$ is identical from one wire to the next. In other words, the crystallographic axes $a_f$ are identical, that is to say parallel to one another, from one wire to the next. The same is true for the crystallographic axes $b_n$ and $c_n$. Thus, the wires have crystallographic properties, in terms of orientation and position of the crystal lattice, that are substantially identical. The optoelectronic device 1 thus has substantially homogeneous crystallographic properties in the wires, which helps to homogenize the electrical and/or optical properties of the light-emitting diodes 2.

The material of the wire has crystallographic properties, in terms of lattice parameter and type of structure, such that it can be epitaxied from the nucleation material. It thus has a lattice parameter such that the lattice mismatch with the nucleation material is less than or equal to 20%. Furthermore, the type of the crystal structure is such that its crystallographic axes $a_f$, $b_f$, $c_f$ may be respectively parallel to the axes $a_n$, $b_n$, $c_n$ of the nucleation material. The crystal structure may be of face-centred cubic type oriented along the direction [111] or of hexagonal type oriented along the direction [0001], or even of orthorhombic type oriented along the direction [111].

The material of the wire is made from a first semiconductor compound, which may be selected from III-V compounds and in particular from III-N compounds, from II-VI compounds or from IV compounds or elements. By way of example, III-V compounds may be compounds such as GaN, InGaN, AlGaN, AlN, InN or AlInGaN, or even compounds such as AsGa or InP. II-VI compounds may be CdTe, HgTe, CdHgTe, ZnO, ZnMgO, CdZnO, CdZnMgO. IV elements or compounds may be Si, C, Ge, SiC, SiGe, GeC. The wire forms a first doped portion 31 according to a first type of conductivity, here of n type.

In this example, the wire is made of GaN that is n-type doped, in particular by silicon. It has a crystal structure of hexagonal type oriented along the direction [0001]. Its lattice parameter is around 3.189 Å. It has here a mean diameter of between 10 nm and 10 μm, for example of between 500 nm and 5 μm, and is here substantially equal to 500 nm. The height of the wire may be between 100 nm and 10 m, for example between 500 nm and 5 μm, and is here substantially equal to 5 μm.

The active zone 32 is the portion of the diode 2 at which most of the light radiation is emitted from the diode 2. It may comprise at least one quantum well made of a semiconductor compound having a band gap lower than those of the wire 31 and of the second doped portion 33. Here it covers the upper edge and the lateral edge of the wire. It may comprise a single quantum well or a plurality of quantum wells in the form of layers or boxes inserted between barrier layers. Alternatively, the active zone 32 may not comprise any quantum well. It may have a band gap substantially equal to that of the wire 31 and of the second doped portion 33. It may be made of a semiconductor compound that is not intentionally doped.

The second doped portion 33 forms a layer that covers and surrounds, at least partially, the active zone 32. It is made of a second semiconductor compound doped according to a second type of conductivity opposite to the first type, that is to say here of p type. The second semiconductor compound may be identical to the first semiconductor compound of the wire, or may comprise the first semiconductor compound and in addition one or more supplementary elements. In this example, the second doped portion 33 may be GaN or InGaN, p-type doped, in particular by magnesium. The thickness of the second doped portion 33 may be between 20 nm and 500 nm, and may be equal to around 150 nm. Of course, the types of conductivity of the first and second portions 31, 33 may be reversed.

The second doped portion 33 may in addition comprise an electron blocking interlayer (not represented) located at the interface with the active zone 32. The electron blocking layer may here be formed of a III-N ternary compound, for example of AlGaN or of AlInN, advantageously which is p-doped. It makes it possible to increase the level of radiative recombinations in the active zones 32.

A second polarization electrode 3B here covers the second doped portion 33 and is suitable for applying electric polarization to the diode 2. It is made of a material that is substantially transparent to the light radiation emitted by the diode 2, for example of indium tin oxide (ITO) or of ZnO. It has a thickness of the order of several nanometres to several tens or hundreds of nanometres.

Thus, when a potential difference is applied to the diode 2 in a forward direction by means of the two polarization electrodes 3A, 3B, the diode 2 emits light radiation, the emission spectrum of which has an intensity peak at a given wavelength. Furthermore, when the same potential difference is applied to the light-emitting diodes 2 of the optoelectronic device 1, the emission spectra are substantially homogeneous between the various diodes 2 in so far as, due to the nucleation structure 10, the wires have substantially homogeneous crystallographic properties.

FIG. 2A is a perspective and exploded view of a growth substrate 11, on which a nucleation portion 16 made of a material comprising a transition metal is directly formed. FIG. 2B is a top view of the growth surface 13 and of the nucleation surface 17. FIG. 2C is an example of wires epitaxied from the nucleation surface 17.

The inventors have demonstrated that the nucleation portions 16 made of material comprising a transition metal, which are formed by growth directly from the growth surface 13 and not from an epitaxied intermediate portion 14, are textured and not epitaxied.

As FIGS. 2A and 2B show, the substrate 11 comprises a monocrystalline material at the growth surface 13, for example silicon of face-centred cubic structure, oriented along the direction [111]. The material is monocrystalline, so that the crystallographic axes $a_s$, $b_s$, $c_s$ are respectively oriented in the same way at any point of the growth surface 13.

The nucleation portion 16 made of a material comprising a transition metal is formed by growth from the growth surface 13, for example by a metal-organic chemical vapour deposition (MOCVD) type process or a sputtering type process. It appears that the nucleation material is textured and not epitaxied. Therefore, it has a favoured direction oriented orthogonally to the plane of the material, namely here the crystallographic axis $c_n$ which is oriented identically at any point of the nucleation surface 17. On the other hand, the crystallographic axes $a_n$ and $b_n$ are respectively not parallel at any point of the nucleation surface 17. The crystallographic axis $c_n$ is not, or is not very dependent on the crystalline structure of the monocrystalline material of the substrate 11.

As FIG. 2C shows, the wires, here made of GaN epitaxied by MOCVD, all have one and the same growth direction, this direction being substantially parallel to the crystallographic axis $c_n$. On the other hand, it appears that the hexagonal shape of the wires is not oriented in an identical manner from one wire to the next, which expresses the fact that the crystallographic axes $a_f$ and $b_f$ are not respectively oriented in an identical manner from one wire to the next. The wires then have different crystallographic properties from one wire to the next, which may result in a certain inhomogeneity in the electrical and/or optical properties of the light-emitting diodes 2.

FIG. 3A is a perspective and exploded view of a growth substrate 11, epitaxied on which are an intermediate portion 14, then an epitaxied nucleation portion 16 made of a material comprising a transition metal. FIG. 3B is a top view of the growth surface 13, of the upper intermediate surface 15 and of the nucleation surface 17. FIG. 3C is an example of wires epitaxied from the nucleation surface 17.

The inventors have thus demonstrated that, surprisingly, the nucleation portions 16 made of a material comprising a transition metal are epitaxied, and not only textured, when they are formed from an epitaxied intermediate layer, and not directly from the monocrystalline growth surface 13 of the substrate 11.

As FIGS. 3A and 3B show, the substrate 11 comprises a monocrystalline material at the growth surface 13, for example silicon of face-centred cubic structure, oriented along the direction [111]. The material is monocrystalline, so that the crystallographic axes $a_s$, $b_s$, $c_s$ are respectively oriented in the same way at any point of the growth surface 13.

The intermediate portion 14 is formed by epitaxial growth from the growth surface 13, for example by MOCVD or sputtering. The crystal lattice of the intermediate material then has crystallographic axes $a_i$, $b_i$, $c_i$ respectively oriented in the same way at any point of the upper intermediate surface 15.

Unlike the example presented in FIGS. 2A to 2C, the nucleation portions 16 made of a material comprising a transition metal, formed for example by MOCVD or sputtering, are then epitaxied and not only textured. Therefore, the crystallographic axes $a_n$, $b_n$, $c_n$ are respectively oriented in the same way at any point of the nucleation surface 17.

As FIG. 3C shows, the wires, here made of GaN epitaxied by MOCVD, all have one and the same growth direction, this direction being substantially parallel to the crystallographic axis $c_n$. Furthermore, it appears that the hexagonal shape of the wires is here oriented identically for all the wires, which expresses the fact that the crystallographic axes $a_f$ and $b_f$ are respectively oriented in an identical manner from one wire to the next. The wires then have substantially identical crystallographic properties from one wire to the next, which may result in a better homogeneity of the electrical and/or optical properties of the light-emitting diodes 2.

The fact that the nucleation portions 16 are actually epitaxied can be verified with the aid of an x-ray diagram by scanning the $\phi$ angle, for the purpose of identifying the presence of a crystallographic alignment, at the nucleation surface, of the crystalline domains (in the case of polycrystalline portions 16) or of various zones of the surface (in the case of monocrystalline portions 16).

The x-ray diffraction pattern along the $\phi$ axis is realized on a diffraction peak having an asymmetric line, that is to say a line corresponding to a crystallographic direction which is not perpendicular to the nucleation surface. The x-ray diffraction scanning along the $\phi$ axis may be carried out in the following manner. The angles 2θ and w are fixed in order to place the planes of interest in diffraction position. The scanning is carried out along the $\phi$ angle, which may vary from 0° to 360°. In the case of an epitaxied material, the crystalline domains have a preferential crystallographic orientation in the plane of the nucleation surface. The $\phi$ scanning then has several diffraction peaks. The number of diffraction peaks is linked to the symmetry of the crystal in the plane. On the other hand, in the case of a textured polycrystalline material, the crystalline domains have no preferential crystallographic orientation in the plane. The $\phi$ scanning then has no diffraction peak.

An example of a process for producing a nucleation structure 10 as illustrated in FIG. 1A is now described. In this example, the nucleation structure 10 is suitable for enabling the nucleation and the epitaxial growth of wires made of n-doped GaN by MOCVD.

During a first step, the growth substrate 11 is supplied, the material of which is monocrystalline at least at the growth surface 13. In this example, the substrate 11 is made of silicon, the structure of which is of face-centred cubic type and is oriented along the direction [111]. Its lattice parameter in the plane of the growth surface 13 is of the order of 3.84 Å.

During a second step, a plurality of intermediate portions 14 are formed in the shape of blocks that are separate from one another and are epitaxied from the growth surface 13.

For this, firstly the epitaxial growth of a layer of an intermediate material is carried out on the upper face of the growth substrate 11. The intermediate material is a crystalline material, which may be monocrystalline or polycrystalline, the crystal lattice of which is in epitaxial relationship with that of the substrate 11.

The intermediate material may be deposited by a process of the chemical vapour deposition (CVD) type, for example of the metal-organic chemical vapour deposition (MOCVD) type, or by a process of molecular beam epitaxy (MBE) type, of hybrid vapour phase epitaxy (HVPE) type, of atomic layer epitaxy (ALE) type, or atomic layer deposition (ALD) type, or even by evaporation or by sputtering.

In this example, the intermediate material is aluminium nitride, the crystalline structure of which is of hexagonal type and is oriented along the direction [0001]. Its lattice parameter in the plane (X,Y) is of the order of 3.11 Å. The intermediate layer has a thickness for example between 0.5 nm, or even 1 nm, and 100 nm, preferably between 2 nm and 50 nm, and may be equal to around 25 nm.

In this example, the intermediate material is deposited by MOCVD. The nominal V/III ratio, defined as the ratio between the molar flow of group V elements to the molar flow of group III elements, i.e. here the N/Al ratio, is between 200 and 1000. The pressure is of the order of 75 torrs. The growth temperature T, measured at the substrate 11, may be, by way of example, greater than or equal to 750° C. for the nucleation phase, then of the order of 950° C. for the growth phase.

Carried out next, by conventional photolithography and etching techniques, is the etching of the continuous layer of the intermediate material in order to form a plurality of intermediate portions 14 in the form of separate blocks. The lateral dimensions, in the plane (X,Y), of the intermediate portions 14 may be between 100 nm and 10 µm, for example around 1 µm.

Thus, the crystallographic axes $a_i$, $b_i$, $c_i$ of the intermediate material, at the upper intermediate surface 15, are respectively parallel to the crystallographic axes $a_s$, $b_s$, $c_s$. Since the growth material is monocrystalline, it follows that each crystallographic axis $a_i$, $b_i$, $c_i$ is parallel at any point of the upper intermediate surface 15.

During a third step, the epitaxial growth of the nucleation portions 16 from the upper intermediate surface 15 of the intermediate portions 14 is carried out.

In this example, the intermediate portions 14 are zones of one and the same continuous layer. The nucleation layer may be formed by a sputter deposition technique, the growth temperature of which is advantageously between ambient temperature, for example 20° C., and 1000° C. Surprisingly, the nucleation layer is also epitaxied when it is deposited by sputtering with a growth temperature between ambient temperature, for example 20° C., and 500° C., for example a temperature substantially equal to 400° C. The power may be of the order of 400 W. The pressure may be of the order of $8 \times 10^{-3}$ torr so as not to modify the crystallographic properties of the intermediate portions 14. The nucleation material comprises a transition metal and may be, for example, a nitride of titanium, zirconium, hafnium, vanadium, niobium, tantalum, chromium, molybdenum or tungsten. The nucleation portions 16 have a thickness for example of between 0.5 nm, or even 1 nm, and 100 nm, preferably between 2 nm and 50 nm, and may be equal to around 25 nm.

Thus, a nucleation layer made of a material comprising a transition metal is obtained, which is formed of nucleation portions 16 epitaxied from the upper intermediate surface 15, and of injection portions 20 formed from the growth surface 13. The injection portions 20 are in general textured and not epitaxied without this being detrimental to the quality of the process.

Thus, the crystallographic axes $a_n$, $b_n$, $c_n$ of the nucleation material, at the nucleation surface 17, are respectively parallel to the crystallographic axes $a_i$, $b_i$, $c_i$ at the upper intermediate surface 15, and to the crystallographic axes $a_s$, $b_s$, $c_s$ at the growth surface 13. Since the growth material is monocrystalline, it follows that each crystallographic axis $a_n$, $b_n$, $c_n$ is parallel at any point of the nucleation surface 17. On the other hand, each crystallographic axis $b_n$, $c_n$ is not necessarily identical, that is to say parallel, at the injection portions 20.

Advantageously, in the case where the nucleation portions 16 are made of a polycrystalline material, a step of crystallization annealing may be carried out so as to obtain a monocrystalline nucleation material. The annealing may be carried out at an annealing temperature corresponding substantially to the crystallization temperature of the nucleation material, namely around 1620° C. in the case here of the transition metal nitride. However, surprisingly, the crystallization of the nucleation material may also be obtained at an annealing temperature below the crystallization temperature, for example in a temperature range extending from 600° C. to 1620° C., preferably between 800° C. and 1200° C., for example equal to around 1000° C. The annealing may be carried out for a duration for example greater than 1 min, preferably greater than 5 min, or even greater than 10 min, for example 20 min. It may be carried out under a flow of nitrogen ($N_2$) and ammonia ($NH_3$). The pressure may be of the order of 75 torrs.

In this example, the process comprises an additional step of depositing the growth mask 18. For this, a layer of dielectric material is deposited so as to cover the nucleation layer, then the through openings 19 are formed so as to locally open onto the nucleation surface 17. The dielectric material is, for example, a silicon oxide (for example $SiO_2$) or a silicon nitride (for example $Si_3N_4$), or even a stack of two different dielectric materials. It may be etched selectively relative to the material of the nucleation portions 16. The dielectric layer has a thickness for example of between 50 nm and 200 nm, for example 100 nm, and the lateral dimensions of the openings 19, in the plane (X,Y), are for example between 100 nm and 10 µm, and may be equal to around 500 nm. Preferably, the lateral dimensions of the openings 19 are smaller than those of the nucleation portions 16, for example at least two times smaller.

Thus a nucleation structure 10 as illustrated in FIG. 1A is obtained, which is suitable for enabling the nucleation and the epitaxial growth of wires of light-emitting diodes 2 as illustrated in FIG. 1B.

An example of a process for producing a plurality of light-emitting diodes 2 as illustrated in FIG. 1B is now described.

During a first step, the wires are firstly formed by epitaxial growth from nucleation surfaces, through openings 19 of the growth mask 18.

The growth temperature is brought to a first value $T_1$, for example between 950° C. and 1100° C., and in particular between 990° C. and 1060° C. The nominal V/III ratio, here the N/Ga ratio, has a first value $(V/III)_1$ between 10 and 100 approximately, for example substantially equal to 30. The elements from group III and group V are derived from precursors injected into the epitaxy reactor, for example trimethylgallium (TMGa) or triethylgallium (TEGa) for gallium, and ammonia ($NH_3$) for nitrogen. The $H_2/N_2$ ratio has a first value $(H_2/N_2)_1$ greater than or equal to 60/40, preferably greater than or equal to 70/30, or even more, for example substantially equal to 90/10. The pressure may be set at around 100 mbar.

Thus a first doped portion 31 is obtained which has a shape of a wire that extends along the longitudinal axis Δ from the nucleation surface 17. The first semiconductor compound of the first doped portion 31, namely here GaN, is n-type doped by silicon. The first n-doped portion 31 here has a height of around 5 µm and a mean diameter of around 500 nm.

The formation of a dielectric layer covering the lateral edge of the first n-doped portion 31 may be carried out at the same time as the formation of the first doped portion 31, according to a process identical or similar to that described in document WO 2012/136665. For this, a precursor of an additional element, for example silane ($SiH_4$) in the case of silicon, is injected with the aforementioned precursors, with a ratio of the molar flows of the gallium precursor to the silicon precursor preferably of between 500 and 5000 approximately. Thus a layer of silicon nitride, for example of $Si_3N_4$ having a thickness of the order of 1 nm is obtained, which coats the lateral edge of the first n-doped portion 31, here over its entire height.

Obtained here are a plurality of wires epitaxied from nucleation surfaces, the crystallographic properties of which are substantially identical, in so far as the nucleation of the wires has been carried out from nucleation surfaces that have substantially the same crystallographic properties.

During a second step, the active zone 32 is formed by epitaxial growth from the exposed surface of the wire, i.e. from the surface not covered by the lateral dielectric layer.

More specifically, a stack of barrier layers and of at least one layer forming a quantum well is formed, said layers being alternated in the direction of the epitaxial growth. The layers forming the quantum wells and the barrier layers may be made of InGaN, with different atomic proportions for the quantum well layers and the barrier layers. By way of example, the barrier layers are made of $In_xGa_{(1-x)}N$ with x equal to 18 atomic % approximately, and the quantum well layers are also made of $In_yGa_{(1-y)}N$, with y greater than x, for example of the order of 25 atomic %, so as to improve the quantum confinement of the charge carriers in the quantum wells.

The formation of the barrier layers and of the quantum well layers may be carried out at a growth temperature value $T_3$ substantially equal to the value $T_2$, namely here 750° C. The V/III ratio has a $(V/III)_3$ value substantially equal to the $(V/III)_2$ value. The $H_2/N_2$ ratio has a value substantially equal to the $(H_2/N_2)_2$ value during the formation of the barrier layers and has a value substantially lower than the $(H_2/N_2)_2$ value during the formation of the quantum well layers, for example 1/99. The pressure may remain unchanged. Thus barrier layers made of InGaN with 18 atomic % approximately of indium and quantum well layers made of InGaN with 25 atomic % approximately of indium are obtained.

During a third step, the second p-doped portion 33 is formed by epitaxial growth so as to cover and surround, at least partially, the active zone 32.

For this, the growth temperature may be brought to a fourth value $T_4$ above the value $T_3$, for example of the order of 885° C. The V/III ratio may be brought to a fourth value $(V/III)_4$ greater than the $(V/III)_3$ value, for example of the order of 4000. The $H_2/N_2$ ratio is brought to a fourth value $(H_2/N_2)_4$ greater than the $(H_2/N_2)_2$ value, for example of the order of 15/85. Finally, the pressure may be reduced to a value of the order of 300 mbar.

A second p-doped portion 33, for example made of p-type doped GaN or InGaN, is thus obtained, which covers and surrounds, here continuously, the active zone 32. The second p-doped portion 33 and the active zone 32 thus form the shell of the diode 2 of core/shell configuration.

Finally, the second polarization electrode 3B may be deposited so as to be in contact with at least one part of the second p-doped portion 33. The second electrode 3B is made of an electrically conductive material that is transparent to the light radiation emitted by the wires. Thus, the application of a direct potential difference to the wires by the two polarization electrodes 3A, 3B leads to the emission of light radiation, the emission spectrum properties of which depend on the composition of the quantum well(s) in the active zone 32.

Thus an optoelectronic device 1 with wired light-emitting diodes 2 having an improved homogeneity of the optical and/or electronic properties of the various diodes 2 is obtained.

Figure 4A:
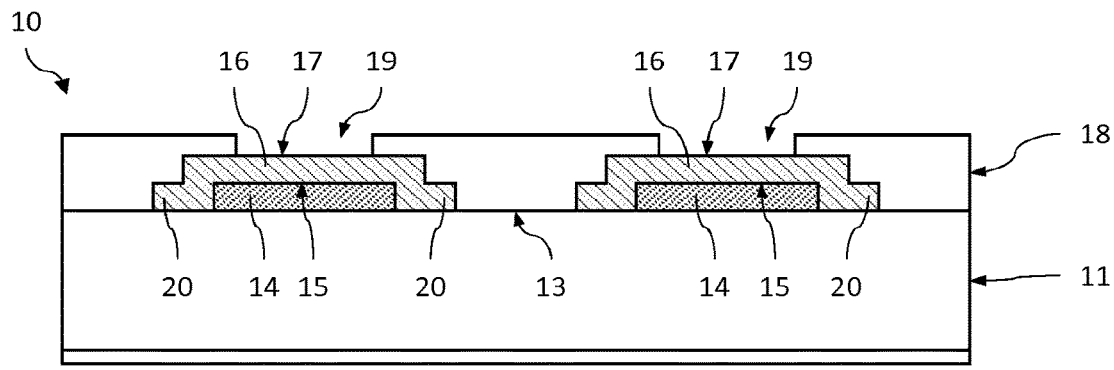
FIGS. 4A to 4F are partial and schematic views, in transverse cross section, of various variants of the nucleation structure.
Figure 4B:
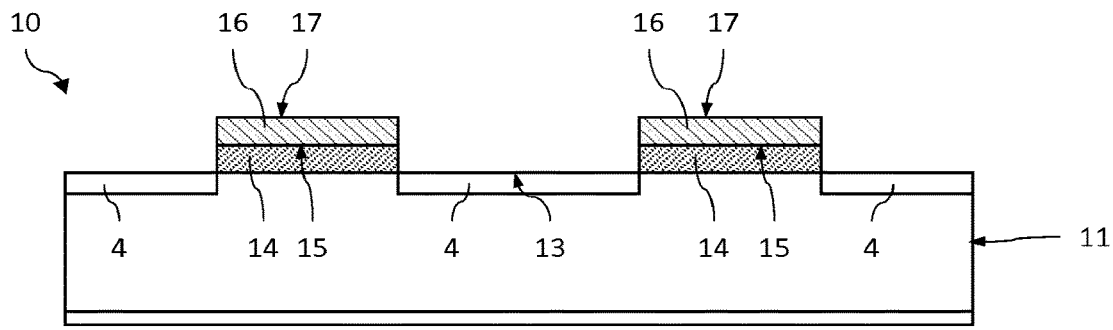
Figure 4C:
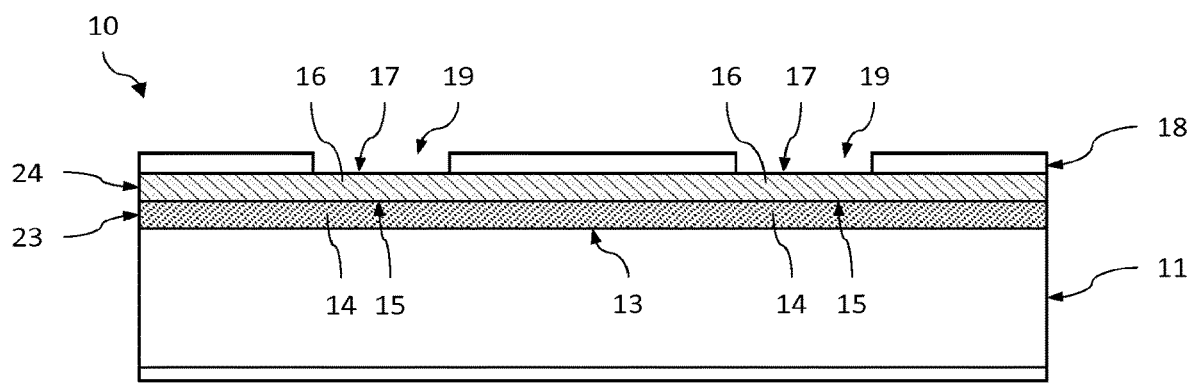

FIGS. 4A to 4C are partial schematic views in transverse cross section of various variants of the nucleation structure 10 illustrated in FIG. 1A.

With reference to FIG. 4A, the nucleation structure 10 according to this variant differs from the one illustrated in FIG. 1A essentially in that the nucleation portions 16 are blocks that are separate from one another and not various zones of one and the same continuous layer. In this example, each nucleation portion 16 comprises an injection portion 20, advantageously peripheral with respect to the nucleation portion 16, which borders the nucleation portion 16 and is in contact with the growth surface 13.

With reference to FIG. 4B, the nucleation structure 10 according to this variant differs from the one illustrated in FIG. 1A essentially in that the stack of the nucleation portions 16 and of the intermediate portions 14 forms blocks that are separate from one another. Furthermore, this structure does not comprise injection portions such as the portions 20 described above. The nucleation structure 10 does not comprise a growth mask 18 in the form of a specific layer made of a dielectric material. However, for the purpose of ensuring the nucleation and the epitaxial growth of the wires in a localized manner from the nucleation surfaces, the substrate comprises a dielectric region 4, at the growth surface 13 that is exposed, i.e. not covered by the intermediate portions 14 and nucleation portions. More specifically, the dielectric region 4 extends to the substrate 11 from the exposed growth surface 13 and connects each intermediate portion 14 to the adjacent intermediate portions 14.

The dielectric regions may be obtained using a process described in document WO 2014/064395, that is to say by nitridation or oxidation of the growth material. In case of the silicon substrate 11, the dielectric regions are made of a silicon oxide (for example $SiO_2$) or of a silicon nitride (for example $Si_3N_4$). In this example, the intermediate portions 14 are advantageously made of an electrically conductive material, such as GaN which is advantageously doped.

With reference to FIG. 4C, the nucleation structure 10 according to this variant differs from the one illustrated in FIG. 1A essentially in that the intermediate portions 14 are various zones of one and the same continuous layer 23. The nucleation portions 16 are also zones of one and the same continuous layer 24. The nucleation surfaces 17 are delimited by openings 19 of the growth mask 18. In this example, the intermediate layer 23 is advantageously made of an electrically conductive material, such as GaN which is advantageously doped.

Figure 4D:
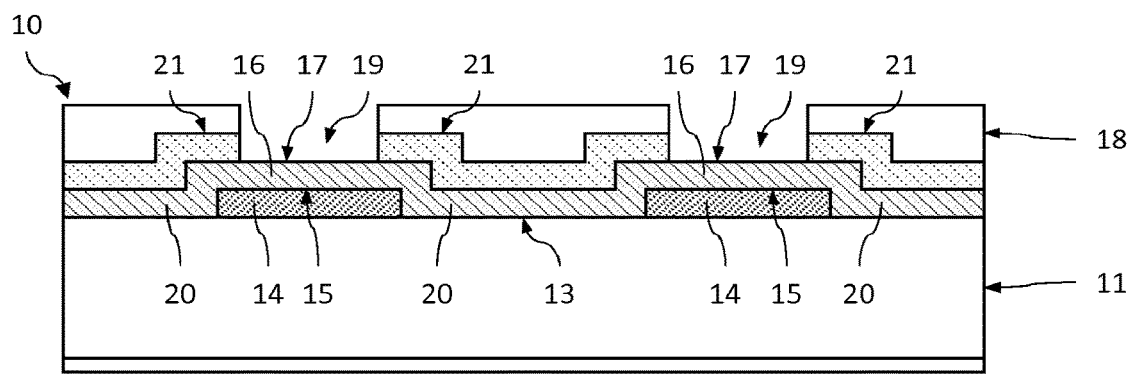
Figure 4E:
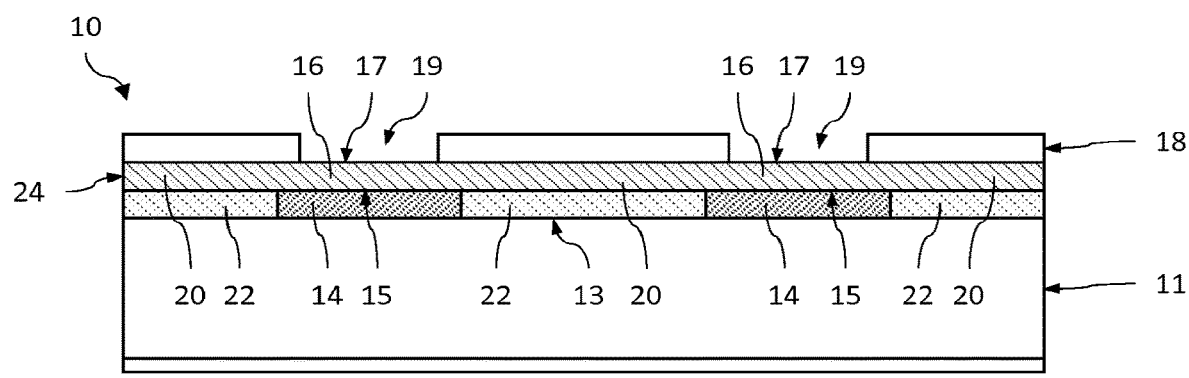
Figure 4F:
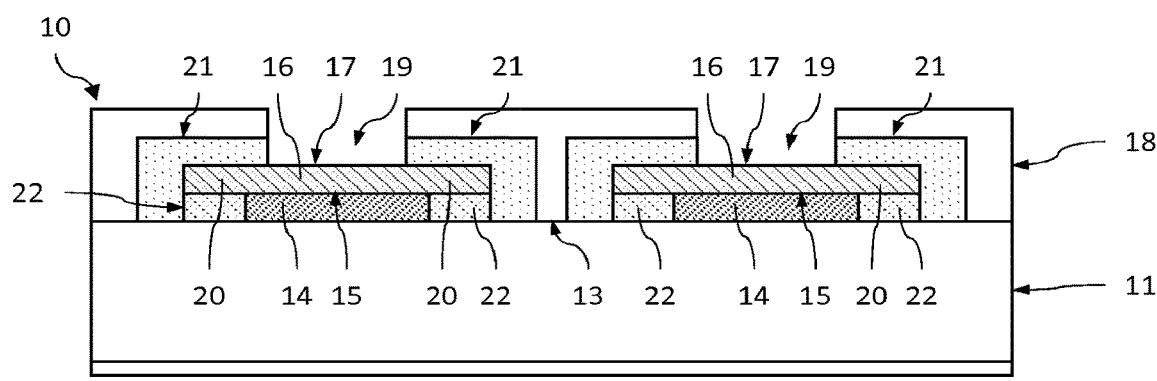

FIGS. 4D to 4F are partial schematic views in transverse cross section of other variants of the nucleation structure 10 illustrated in FIG. 1A, in which the nucleation structure 10 comprises other injection portions made of a material comprising a transition metal.

With reference to FIG. 4D, the nucleation structure 10 according to this variant differs from the one illustrated in FIG. 1A essentially in that it additionally comprises upper injection portions 21 intended to improve the injection of the charge carriers into the wires.

The upper injection portions 21 here cover the injection portions 20, and cover a part of the nucleation portions 16. Thus, they delimit, in the plane (X,Y), the nucleation surfaces, and help to delimit, with the growth mask 18, the through openings 19. In other words, the second injection portions open at the through openings 19 and partly delimit the peripheral edge of the opening. Thus, during the nucleation and the epitaxial growth of the wires, each wire occupies the volume of the through openings 19 so that it is in contact, at its lateral edge, with the upper injection portion 21. Increased in this way are, on the one hand, the local thickness of the portions made of materials comprising a transition metal, which improves the circulation of the charge carriers and, on the other hand, the contact interface between the wire and the portions made of materials comprising a transition metal. The injection of the charge carriers into the wires from the electrically conductive substrate 11 is then improved.

The upper injection portions 21 are here zones of one and the same continuous layer but, alternatively, they may take the form of blocks that are separate from one another. They may be formed of one and the same material comprising a transition metal, or be formed from a stack of several identical or different materials comprising a transition metal.

The upper injection portions 21 are here produced from a second material comprising a transition metal, that is to say that it may be made of a transition metal or made of a compound comprising a transition metal, for example a nitride or a carbide of a transition metal. The second material comprising a transition metal may be identical to or different from the material of the nucleation portions 16, and advantageously has an electrical resistivity lower than this material. By way of example, the nucleation material may be selected from tantalum nitride TaN, hafnium nitride HfN, niobium nitride NbN, zirconium nitride ZrN, titanium nitride TiN and the material of the upper injection portions 21, namely the second material comprising a transition metal, may be a titanium nitride.

The upper injection portions 21 may have a thickness of between 1 nm and 100 nm, preferably of between 1 nm and 50 nm, for example of 25 nm.

The upper injection portions 21 may be produced by a deposition of a continuous layer of a material comprising a transition metal, so as to cover the nucleation portions 16 and the injection portions. It may then be covered by the layer of a dielectric material intended to form the growth mask 18.

The through openings 19 are then advantageously made in two steps. Firstly, a step of selective etching of the dielectric material with respect to the material of the upper injection portions 21 is carried out, for example by dry etching of reactive-ion etching (RIE) type. The continuous layer of the second material comprising a transition metal thus forms an etch stop layer. Thus a first opening is obtained, located facing the nucleation surface 17, which opens onto the second material. Secondly, a step of selective etching of the second material with respect to the nucleation material is carried out from the first opening, for example by wet etching, the etchant of which is for example hydrofluoric acid. Thus the through openings 19 which open onto the nucleation surface 17 are formed. Thus, the nucleation surface 17 is protected from any potential degradation linked to the dry etching step.

With reference to FIG. 4E, the nucleation structure 10 according to this variant differs from the one illustrated in FIG. 1A essentially in that it additionally comprises lower injection portions 22, intended to improve the injection of the charge carriers into the wires.

The lower injection portions 22 are here placed in contact with the growth surface 13, between the intermediate portions 14, and advantageously in contact with these portions. They are thus covered by the injection portions 20 and in contact with these portions. The injection portions 20 and the nucleation portions 16 are here different zones of one and the same continuous layer 24.

The lower injection portions 22 are here produced from a third material comprising a transition metal, that is to say that it may be made of a transition metal or made of a compound comprising a transition metal, for example a nitride or carbide of a transition metal. The third material comprising a transition metal may be identical to or different from the material of the nucleation portions 16, and advantageously has an electrical resistivity lower than this material. By way of example, the nucleation material may be selected from tantalum nitride TaN, hafnium nitride HfN, niobium nitride NbN, zirconium nitride ZrN, titanium nitride TiN and the material of the lower injection portions 22, namely the third material comprising a transition metal, may be a titanium nitride.

The lower injection portions 22 may have a thickness of between 1 nm and 100 nm, preferably of between 1 nm and 50 nm, for example of 25 nm. They may have a thickness substantially equal to that of the intermediate portions 14.

Thus, the thickness of the portions made of materials comprising a transition metal is locally increased, which improves the circulation of the charge carriers, and improves the injection of the charge carriers from the electrically conductive substrate 11 into the wires.

With reference to FIG. 4F, the nucleation structure 10 according to this variant differs from the one illustrated in FIG. 1A essentially in that it comprises lower injection portions 22 and upper injection portions 21.

The lower injection portions 22 are in contact with the growth surface 13 and are covered by the injection portions 20. They are advantageously in contact with the intermediate portions 14. They are here blocks that are separate from one another, but may as a variant form zones of a continuous layer.

The upper injection portions 21 are in contact with the upper face of the injection portions and partially cover the nucleation portions 16 in order to delimit the nucleation surfaces. They open into the through openings 19. In this example, they are also in contact with the growth surface 13 and cover the vertical side walls of the lower injection portions 22 and of the injection portions. They are here blocks that are separate from one another, but may as a variant form zones of a continuous layer.

The second material of the upper injection portions 21 and the third material of the lower injection portions 22 are materials comprising a transition metal, that is to say that they may be made of a transition metal or of a compound comprising a transition metal, for example a nitride or carbide of a transition metal. The second and third transition metal nitrides may be identical to or different from one another and from the material of the nucleation portions 16. They may be identical to one another, and be different from the nucleation material and advantageously have an electrical resistivity lower than this material. By way of example, the nucleation material may be selected from tantalum nitride TaN, hafnium nitride HfN, niobium nitride NbN, zirconium nitride ZrN, titanium nitride TiN, and the second and third transition metal nitrides may be a titanium nitride.

Thus, the thickness of the portions made of materials comprising a transition metal is increased in particular by locally forming a stack of injection portions in contact with the nucleation portions 16, which improves the circulation and the injection of the charge carriers. Furthermore, the contact interface between the wire and the portions made of materials comprising a transition metal is increased. The injection of the charge carriers from the electrically conductive substrate 11 into the wires is then improved.

Furthermore, it may be advantageous to carry out the growth of the wires made of semiconductor material predominantly comprising a III-V compound, for example, made of GaN, according to the polarity of the group III element, for example gallium, and not according to the polarity of the group V element, for example nitrogen.

Specifically, such wires may have improved optical and/or electronic properties, in so far as the inversion domain boundaries that may appear in the case of wires of nitrogen polarity tend to be reduced or even eliminated, and the roughness that the plane c of the wires may have, that is to say the upper surface of the wires oriented substantially orthogonally to the growth axis c, is reduced.

Generally, a wire made of a III-V compound may grow according to the polarity of the group III element or according to the polarity of the group V element, along a favoured growth direction. If the wire is cut along a plane perpendicular to the growth direction, the exposed face essentially has atoms of the group III element, respectively of the group V element, in the case of growth according to the polarity of the group III element, respectively of the group V element.

It appears that the wires made of a III-V compound, for example made of GaN, and obtained by growth according to the nitrogen polarity, have inversion domain boundaries in which the wire is locally of gallium polarity. Furthermore, it appears that the plane c of the wire has a surface roughness. These characteristics of the wires of nitrogen polarity may lead to a degradation of the optical and/or electronic properties of the wire.

The inventors have observed that the epitaxial growth of the wires according to the polarity of the group III element, that is to say according to the gallium polarity in the case of GaN, may be obtained when the wires are made from the nucleation structure described above on the one hand, and when no nitridation annealing is applied to the nucleation portions 16 before the growth of the wires on the other hand. Specifically, the nucleation portions 16, and in particular the nucleation surfaces 17, are not subjected, at the same time, either to a temperature greater than or equal to 800° C., and in particular to a temperature greater than or equal to 1000° C., or to a flow of ammonia $NH_3$. Independently of the flow of ammonia, the nucleation surfaces 17 may be subjected to a flow of molecular nitrogen $N_2$ without this modifying the growth of the wires according to such and such polarity.

Thus, the inventors have observed, by way of illustration, that the growth of the wires made of gallium nitride GaN according to the gallium polarity, from the nucleation portions 16 made of niobium nitride NbN, is obtained when, before the growth of the wires, the nucleation surfaces 17 are not subjected to a nitridation annealing, especially when they are not subjected, at the same time, to a temperature greater than or equal to 800° C. and to a flow of ammonia. The growth of the wires according to the gallium polarity is also obtained when the nucleation surfaces 17 are subjected to a flow of ammonia but not at a temperature greater than or equal to 800° C. And the growth of the wires according to the gallium polarity is also obtained when the nucleation surfaces 17 are subjected to a temperature greater than or equal to 800° C., for example 1000° C., but not to a flow of ammonia. On the other hand, the growth according to the nitrogen polarity is obtained when a nitridation annealing is applied to the nucleation portions 16, that is to say when the nucleation surfaces 17 are subjected both to a temperature for example of 1000° C. and to a flow of ammonia.

During the initiation of the growth phase of the wires, and in particular during the nucleation phase of the III-V compound of the wires from nucleation surfaces, the nucleation surfaces are subjected to a flow of ammonia. It is then preferable for the temperature to be below 800° C. Subsequently, when the III-V compound continuously covers the nucleation surfaces 17, the temperature may be increased above 800° C. and the flow of ammonia maintained, without this adversely affecting the growth of the wires according to the polarity of the group III element.

Preferably, the material of the nucleation portions 16 is selected from a nitride of titanium TiN, of zirconium ZrN, of hafnium HfN, of vanadium VN, of niobium NbN, of tantalum TaN, of chromium CrN, of molybdenum MoN or of tungsten WN, or a carbide of titanium TiC, of zirconium ZrC, of hafnium HfC, of vanadium VC, of niobium NbC or of tantalum TaC. Preferably, the nucleation material is selected from a nitride of titanium TiN, of zirconium ZrN, of hafnium HfN, of niobium NbN, or of tantalum TaN. Preferably, the nucleation material is a nitride of niobium NbN.

Particular embodiments have just been described. Various variants and modifications will be apparent to a person skilled in the art.

A radial, or core/shell, configuration has been described in so far as the second doped portion surrounds and covers, at least partially, the active zone and the end of the wire. As a variant, the light-emitting diodes may have an axial configuration in which the wire, the active zone and the second doped portion are stacked on top of one another along the longitudinal axis Δ without the lateral edge of the wire being covered by the active zone and the second doped portion. The lateral edge is understood to mean a surface of a portion of the wire that extends substantially parallel to the longitudinal axis Δ.

Three-dimensional semiconductor elements in the form of wires have been described. As a variant, the three-dimensional elements may have a pyramidal shape, for example a polygon-based conical or frustoconical shape.

An optoelectronic device comprising light-emitting diodes capable of emitting electromagnetic radiation has also been described. As a variant, the optoelectronic device may be capable of receiving and detecting electromagnetic radiation, for the purpose of converting it into an electrical signal.

The invention claimed is:

1. A nucleation structure configured for the epitaxial growth of three-dimensional semiconductor elements, comprising:
    a substrate including a monocrystalline material forming a growth surface on which lies a plurality of nucleation portions made of a material comprising a transition metal, and a plurality of intermediate portions, each intermediate portion being made of an intermediate crystalline material epitaxied from the growth surface, thus having an alignment of the crystallographic orientations of its crystal lattice with those of the crystal lattice of the crystalline material of the substrate in at least one direction in the plane of the intermediate crystalline material and at least one direction orthogonal to the plane of the material, and defining an upper intermediate surface, on the opposite side to the growth surface,
    wherein each nucleation portion is made of a material including a transition metal forming a nucleation crystalline material, epitaxied from the upper intermediate surface, thus having an alignment of the crystallographic orientations of its crystal lattice with those of the crystal lattice of the intermediate material in at least one direction in the plane of the nucleation crystalline material and at least one direction orthogonal to the plane of the material, and defining a nucleation surface, on the opposite side to the upper intermediate surface and configured for the epitaxial growth of a three-dimensional semiconductor element.

2. The nucleation structure according to claim 1, wherein the intermediate portions form blocks being separate from one another, and the nucleation portions are at least partly bordered by and in contact with injection portions, made of a material including a transition metal, which lie in contact on the growth surface, the injection portions then being textured from the growth surface, thus having a single favoured crystallographic orientation in a direction orthogonal to the plane of their material.

3. The nucleation structure according to claim 1, wherein the intermediate material is selected from aluminium nitride, III-V compounds and oxides of aluminium, titanium, hafnium, magnesium and zirconium, and has a hexagonal, face-centred cubic or orthorhombic crystal structure.

4. The nucleation structure according to claim 1, wherein the nucleation material is selected from titanium, vanadium, chromium, zirconium, niobium, molybdenum, hafnium, tantalum and tungsten, or from a nitride or a carbide of titanium, vanadium, chromium, zirconium, niobium, molybdenum, hafnium, tantalum and tungsten, and has a hexagonal or face-centred cubic crystal structure.

5. The nucleation structure according to claim 1, wherein the monocrystalline material of the substrate is selected from a III-V compound, a II-VI compound or a IV element or compound and has a hexagonal or face-centred cubic crystal structure.

6. The nucleation structure according to claim 5, wherein the material of the substrate is electrically conductive.

7. The nucleation structure according to claim 1, further comprising:
   at least one lower injection portion made of a material including a transition metal, positioned in contact with the growth surface and covered by an injection portion formed in one piece with and from same material as the nucleation portion, the at least one lower injection portion being textured from the growth surface, and having a single favoured crystallographic orientation in a direction orthogonal to the plane of its material.

8. The nucleation structure according to claim 1, further comprising:
   at least one upper injection portion made of a material including a transition metal, positioned in contact with the nucleation portion and partly covering the nucleation surface.

9. The nucleation structure according to claim 1, further comprising:
   at least one lower injection portion made of a material including a transition metal, positioned in contact with the growth surface and covered by a portion formed with the nucleation portion.

10. An optoelectronic device, comprising:
    the nucleation structure according to claim 1; and
    a plurality of three-dimensional semiconductor elements each epitaxied from a respective nucleation surface, the three-dimensional semiconductor elements having an alignment of the crystallographic orientations of their crystal lattice with those of the crystal lattice of the nucleation material, in at least one direction in the plane of the material of the three-dimensional elements and at least one direction orthogonal to the plane of the material.

11. The optoelectronic device according to claim 10, wherein each three-dimensional semiconductor element is produced from a semiconductor material selected from a III-V compound, a II-VI compound, a IV element or compound.

12. The optoelectronic device according to claim 10, wherein the semiconductor material of each three-dimensional semiconductor element predominantly includes a III-V compound formed from a first element from group III and from a second element from group V, the three-dimensional semiconductor elements having a polarity of the first element.

13. A process for producing the nucleation structure according to claim 1, comprising:
    epitaxial growing of the nucleation portions by sputtering at a growth temperature between ambient temperature and 500° C.

14. The process for producing the nucleation structure according to claim 13, further comprising:
    forming at least one upper injection portion positioned in contact with the nucleation portions and partly covering the nucleation surface;
    epitaxial growing of a layer made of a second material including a transition metal covering the nucleation surface;
    depositing a layer of a dielectric material covering the layer made of the second material;
    localized and selective dry etching the dielectric material with respect to the second material, so as to form a first opening located facing the nucleation surface and opening onto the second material; and
    localized and selective wet etching the second material with respect to the nucleation material, through the first opening, so as to form an opening that opens onto the nucleation surface.

15. The process for producing the nucleation structure according to claim 13, further comprising:
    crystallization annealing of the nucleation portions at a temperature between 600° C. and 1200° C.

16. A process for producing the optoelectronic device according to claim 10, comprising:
    producing the nucleation structure; and
    growing a plurality of three-dimensional semiconductor elements each epitaxied from a nucleation surface, so that the nucleation portions, between the producing and the growing, have not been subjected to a nitridation annealing.

17. The production process according to claim 16, wherein between the producing and the growing, the nucleation surfaces are not subjected, at the same time, to an annealing temperature greater than or equal to 800° C. and to a flow of ammonia.

* * * * *